(12) United States Patent
Sanjeevarao et al.

(10) Patent No.: US 11,328,784 B2
(45) Date of Patent: May 10, 2022

(54) MEMORY WITH CELLS HAVING MULTIPLE SELECT TRANSISTORS

(71) Applicant: NXP USA, INC., Austin, TX (US)

(72) Inventors: Padmaraj Sanjeevarao, Austin, TX (US); Jon Scott Choy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/032,913

(22) Filed: Sep. 25, 2020

(65) Prior Publication Data

US 2022/0101934 A1     Mar. 31, 2022

(51) Int. Cl.
*G11C 17/16*     (2006.01)
*G11C 17/18*     (2006.01)
*G11C 13/00*     (2006.01)

(52) U.S. Cl.
CPC .......... *G11C 17/18* (2013.01); *G11C 13/0028* (2013.01); *G11C 2213/79* (2013.01)

(58) Field of Classification Search
CPC ....................................................... G11C 17/16
USPC ............................................................ 365/96
See application file for complete search history.

(56) References Cited

U.S. PATENT DOCUMENTS

| | | |
|---|---|---|
| 6,927,997 B2 | 8/2005 | Lee et al. |
| 10,374,152 B2 | 8/2019 | Annunziata et al. |
| 2020/0051653 A1* | 2/2020 | Kurjanowicz ......... G11C 17/10 |
| 2020/0327937 A1* | 10/2020 | Nguyen ............. G11C 13/0097 |

* cited by examiner

*Primary Examiner* — Min Huang
(74) *Attorney, Agent, or Firm* — David G. Dolezal

(57) ABSTRACT

A memory includes memory cells having two select transistors per cell. Each of the two select transistors are coupled to two different word lines with each word line being controlled by a separate addressable word line driver circuit. In some embodiments, providing two different word lines from two different word line drivers may provide for a memory where the word lines can apply different voltages based on the memory operation being performed.

10 Claims, 8 Drawing Sheets

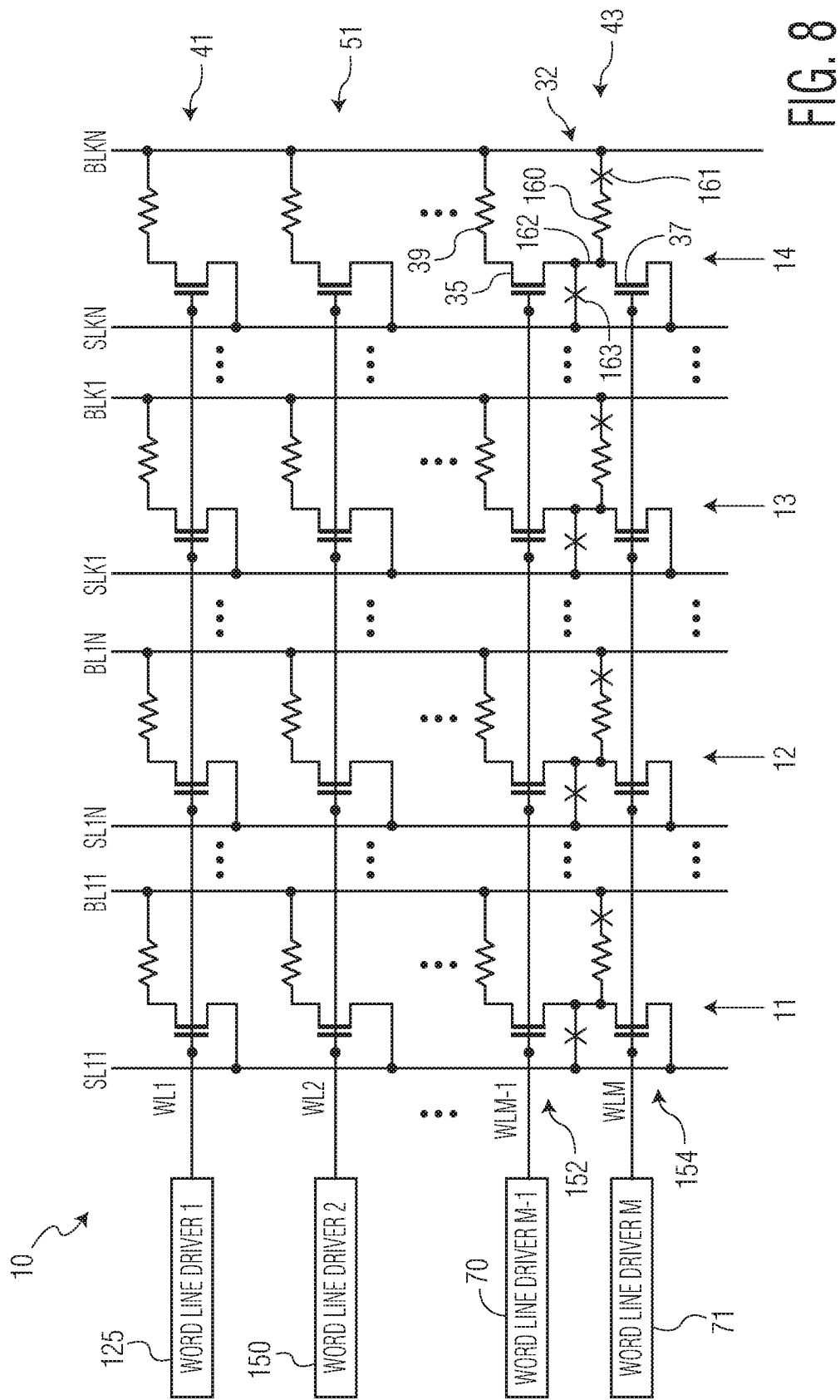

MEMORY WITH CELLS HAVING MULTIPLE SELECT TRANSISTORS

BACKGROUND OF THE INVENTION

Field of the Invention

This invention relates in general to a memory.

Background

Memories include memory cells for storing data. The memory cells are written to by the application of voltages or currents to the terminals of the memory cells.

BRIEF DESCRIPTION OF THE DRAWINGS

The present invention may be better understood, and its numerous objects, features, and advantages made apparent to those skilled in the art by referencing the accompanying drawings.

FIG. 8 is a circuit diagram of a memory array according to one embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes memory cells having two select transistors per cell. Each of the two select transistors are coupled to two different word lines with each word line being controlled by a separate addressable word line driver circuit. In some embodiments, providing two different word lines from two different word line drivers may provide for a memory where the word lines can apply different voltages based on the memory operation being performed. These different word line voltages may reduce punch through voltage and reduce the current electrode-to-current electrode voltage across a select transistor during a memory operation in some embodiments.

Figure 1:
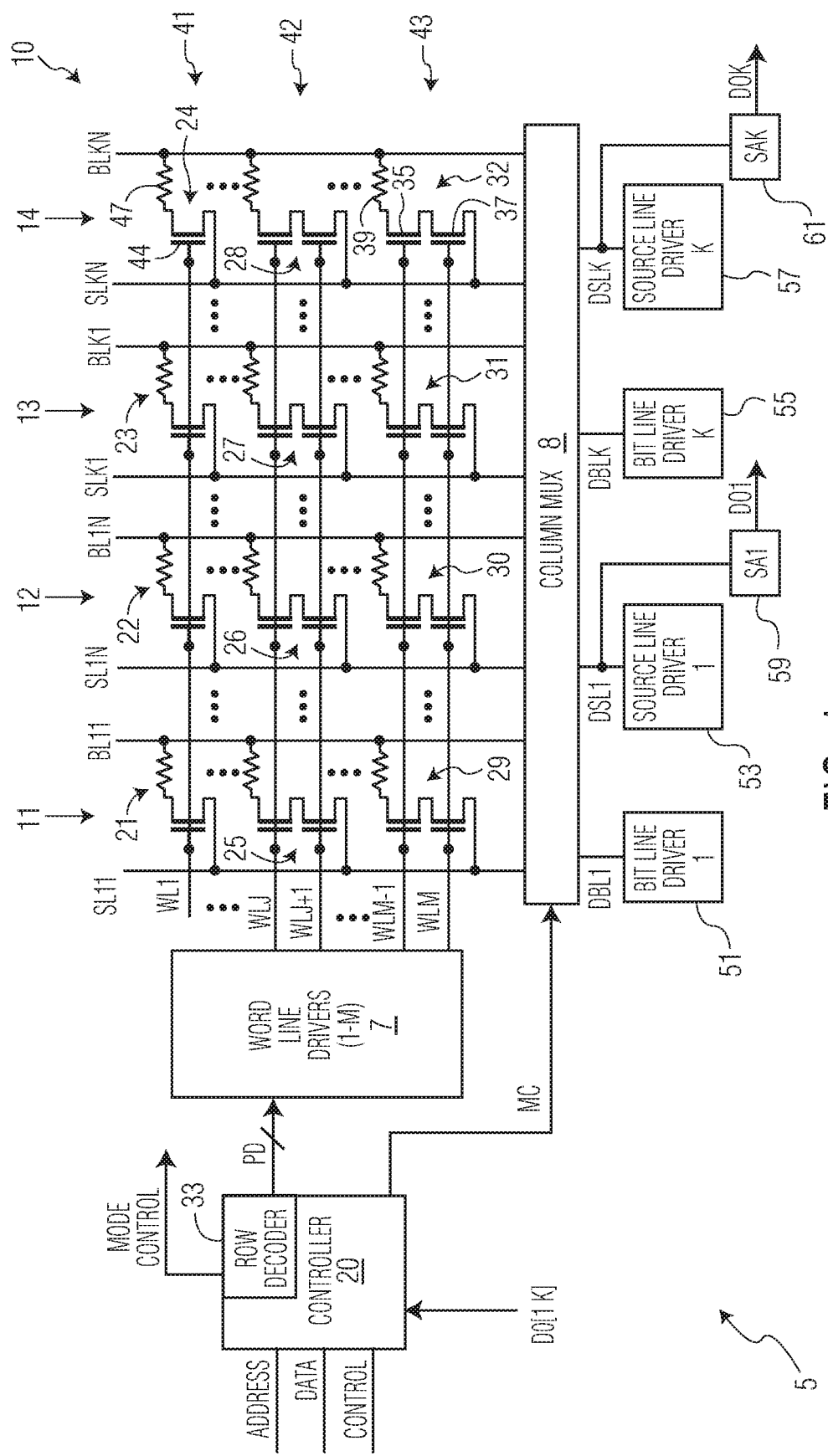
FIG. 1 is a circuit diagram of a memory according to one embodiment of the present invention.

FIG. 1 is a circuit diagram of a memory 5 according to one embodiment of the present invention. Memory 5 includes an array 10 of memory cells for storing data. The memory cells 21-32 of array 10 are arranged in columns 11-14 and rows 41-43. Cells 21, 25, and 29 are located in column 11, cells 22, 26, and 30 are located in column 12, cells 23, 27, and 31 are located in column 13, and cells 24, 28, and 32 are located in column 14. Cells 21-24 are located in row 41, cells 25-28 are located in row 42, and cells 29-32 are located in row 43. The cells of each column (11-14) are coupled to a source line (SL11-SLKN) and a bit line (BL11-BLKN).

In the embodiment shown, the cells of row 41 are coupled to one word line WL1. In FIG. 1, the cells of row 41 include one select transistor (e.g. transistor 44 for cell 24) that is coupled in series with a storage element (47) for storing a value. Word line WL1 is connected to the gate of each select transistor of a row 41. The source of each transistor of row 41 is connected to a source line (SL11-SLKN) and the storage element is connected to a bit line (BL11-BLKN). For example, the source of select transistor 44 of cell 24 is connected to source line SLKN and an electrode of storage element 47 is connected to bit line BLKN. The drain of each select transistor (44) is connected to the other electrode of the storage element 47. In the embodiment shown, the select transistors of array 10 are NFETs, but may be of other types of transistors in other embodiments.

The cells of rows 42 and 43 each include two select transistors that are coupled in series with the storage element. For example, cell 32 includes select transistor 37, select transistor 35, and a storage element 39. The source of transistor 37 is connected to source line SLKN, the drain of transistor 37 is connected to the source of select transistor 35, and the drain of select transistor 35 is connected to an electrode of storage element 39. The other electrode of storage element 39 is connected to bit line BLKN. Accordingly, transistor 35 is coupled in series between select transistor 37 and storage element 39 where select transistor 37 is coupled on the source side of transistor 35 and storage element 39 is coupled on the drain side of select transistor 35. The other memory cells of rows 42 and 43 are configured similarly. In one embodiment, the two select transistors of each cell are of the same size.

In the embodiment shown, each memory cell of rows 42 and 43 is coupled to two word lines, with the gate of one of the select transistor of the cell connected to one of the word lines associated with the row and the gate of the other select transistor is connected to the other word line associated with the row. For example, word line WLM−1 is connected to the gate of select transistor 35 of cell 32 of row 43 and word line WLM is connected to the gate of select transistor 37 of cell 32. In the embodiment shown, the word lines of a row are biased with an asserted voltage based on an address of a memory operation to make the select transistors of an addressed row conductive to access the storage elements of the cells of the row during a memory operation.

In one embodiment, the memory cells of array 10 are resistive memory cells such as ReRAM, MRAM, phase change memory (PCM), or conductive bridging RAM (CBRAM) cells where a value is stored in the memory cell by setting the resistance of the storage element of the memory cell. However, the cells of memory 5 may be of other memory cell types in other embodiments (e.g. Flash, SRAM, DRAM). For some types of MRAM cells, the storage element (39) includes a magnetic tunnel junction. For some types of ReRAM cells, the storage element includes a memristor. For resistive memory cells, the ability to provide different voltages on multiple word lines associated with a row of cells during a memory operation may prevent damage to a select transistor of the cell during a write to the resistive memory cell. This may also be advantageous with other types of memory cells as well.

Memory 5 includes a controller 20 for controlling the operations of memory 5. Controller 20 is coupled to a bus that includes ADDRESS, DATA, and CONTROL lines received from processing circuitry (not shown) for performing data accesses to memory 5. In one embodiment, the bus may be coupled to a data processor or DMA that issues instructions to either write data to a particular address location or read data from a particular address location of the memory. In response to the received instructions, controller 20 issues control signals to the various circuits of memory 5 to access the cells at the requested memory location. In some embodiments, memory 5 is located on the same integrated circuit as the processing circuitry (not shown), but in other embodiments, may be located on different integrated circuits. In the embodiment shown, controller 20 includes a row decoder 33 that produces decode signals PD to access the rows of array 10 to perform a memory access to the cells of array 10. The PD signals produced are based on the address received on the ADDRESS lines and are used to control the word line drivers 7 to selectively provide an asserted word line voltage or an unasserted word line voltage during a memory operation.

Each of the columns (11-14) of memory 5 is coupled to column multiplexer (COLUMN MUX) 8. In one embodiment, based on the mux control signals (MC) from controller 20, multiplexer 8 selects the selected bit lines of bit lines BL11-BLKN and the selected source lines (SL11-SLKN) of the selected columns 11-14 to provide to the appropriate data bit lines DBL1-DBLK and data source lines DSL1-DSLK, respectively, for writing to the cells of the selected columns of memory array 10 during a write operation or reading from cells of selected columns during a read operation. The data bit lines DBL[1:K] are coupled to bit line drivers [1:K] (51, 55). The data source lines DSL[1:K] are coupled to source line drivers [1:K] (53, 57) and coupled to sense amplifiers SA[1:K] (59, 61) for reading data from the selected columns.

In some embodiments, memory 5 includes a reference cell or cells (not shown) having a characteristic (e.g. resistance, voltage, current) that is compared against the characteristic of the cell being read to determine the value being stored. The reference cell or cells may be located in the sense amplifiers, a separate circuit, or located in array 10. During a read operation, the sense amplifiers (59, 61) provide signals DO1-DOK to controller 20 which is indicative of the data being read. Controller 20 then provides that information to the processing circuitry (not shown).

Controller 20 selects which columns 11-14 will be the selected columns that are written to or read from by setting the mux control MC signals to the appropriate values. In one embodiment, the mux control signals are based on the address, data, and control signals received by controller 20 on the ADDRESS, DATA, and CONTROL lines from the processing circuitry (not shown). Mux 8, source line drivers 53, 57, and bit line drivers 51, 55 are utilized to set the voltages of the source lines and bit lines of the selected columns and unselected columns during memory reads and writes.

Array 10 has N*K number of columns with 4 being shown in FIG. 1. K is the maximum number of columns that can be selected at one time where memory 5 has K number of bit line drivers 51, 55, source line drivers 53-57, and sense amplifiers 59-61. K can be any number (e.g. 32, 64, 256, 512) and is the largest amount of data that can be written to or read from array 10 at a time. N represents the mux ratio of total columns to selected columns. In some embodiments, N may be 4, 16, or 32, but may be of other values in other embodiments.

Memory includes M number of word lines, each with a corresponding word line driver of word line drivers (1-M) 7. M can be 256, 512, or 1024, but maybe another number in other embodiments. In the embodiment shown, the number of rows of array 10 is less than M in that at least some of the rows (42 and 43) include two word lines. In FIG. 1, J is the word line that is the first word line for a row associated with two word lines. In some embodiments, the number of rows of an array is equal to $(J-1)+(M-(J-1))/2$ In some embodiments, all the rows of array 10 have two word lines, where the number of rows would be $\frac{1}{2}M$. In some embodiments, the rows with two word lines may not be in contiguous rows of an array.

Figure 2:
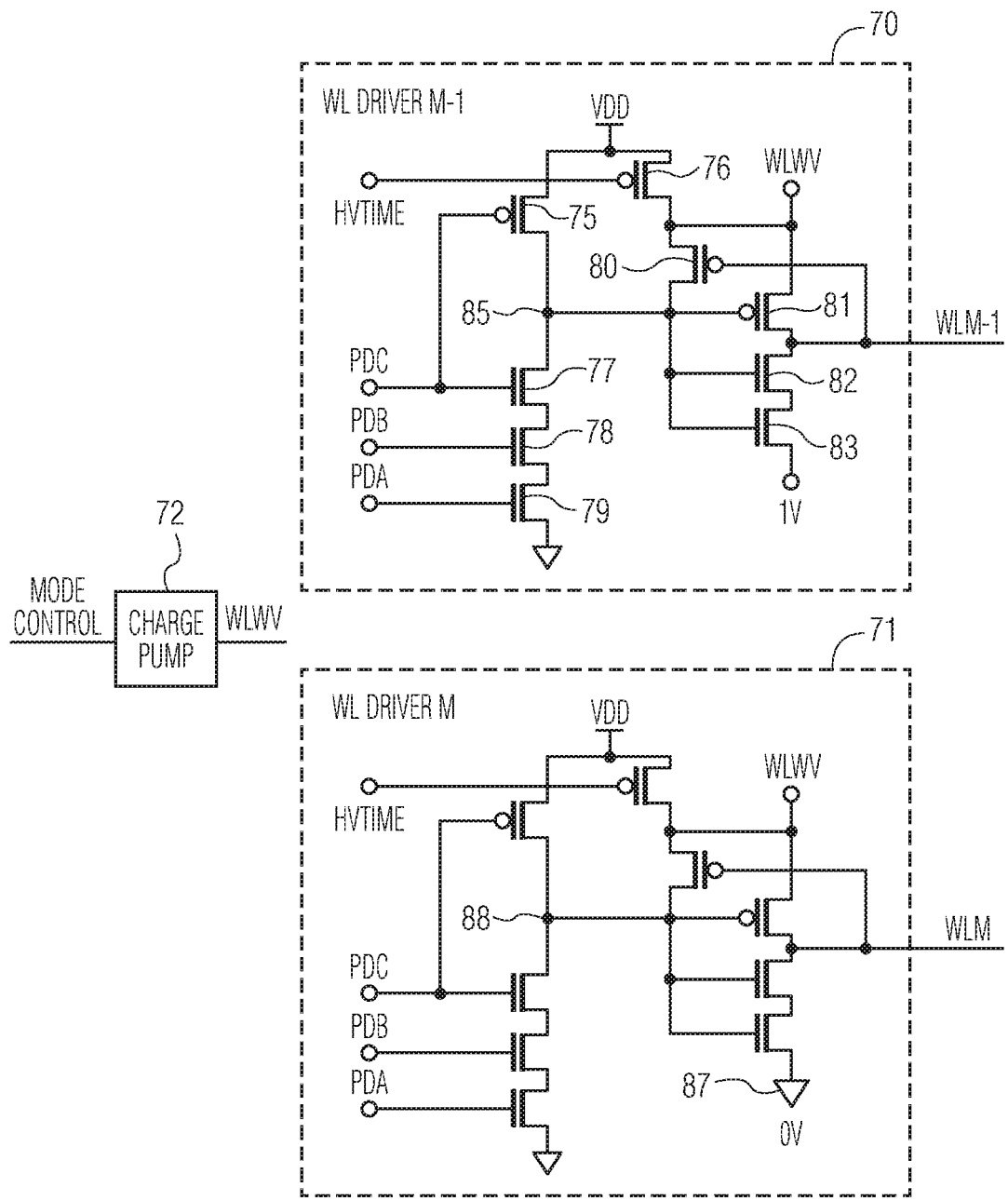
FIG. 2 is a circuit diagram of word line driver circuits according to one embodiment of the present invention.

FIG. 2 shows is a circuit diagram of word lines drivers 70 and 71 of word line drivers 7 according to one embodiment. Drivers 70 and 71 control the voltages on word lines WLM−1 and WLM, respectively for the cells of row 43. Driver 70 includes three NFET transistors 77-79 that each receive a decode signal (PD[A:C]) from controller 20 that is based on the address of the instruction received from the processing circuitry and indicates the row of the addressed memory location. All three decode signals (PD[A:C]) being high indicate that the accessed memory location is on the row coupled to word line WLM−1.

Driver 70 includes circuitry for providing a word line signal at an asserted voltage in response to the three decode signals (PD[A:C]) being high. During a time when no memory operations are being performed, the PDC signal being low causes transistor 75 to be conductive to pull control node 85 to 1.8V which makes transistors 82 and 83 conductive to pull word line WLM−1 to an unasserted voltage of 1V. During this time, transistor 81 is nonconductive in that node 85 is at 1.8V. At this time, terminal WLWV is at 1.8V in that transistor 76 is conductive and charge pump 72 is not on.

Transistor 80 acts a keeper switch that is conductive when word line WLM−1 is not asserted. Thus, if PDC were to go high (and either PDA or PDB remains low) during a time when word line WLM−1 is non asserted, node 85 will still remain high at the voltage of WLWV. Transistor 80 is a weaker transistor than transistors 77-79 allowing for those transistors to pull node 85 low when made conductive even if transistor 80 is conductive.

When word line WLM−1 is to be asserted, all three decode signals PD[A:C] go high making transistors 77-79 conductive to pull node 85 to ground. Node 85 being pulled to ground makes PFET 81 conductive to pull word line WLM−1 to an asserted word line voltage provided by terminal WLWV. If the HVTIME signal is low at this time, transistor 76 is conductive and terminal WLWV is biased at 1.8V.

Figure 5:
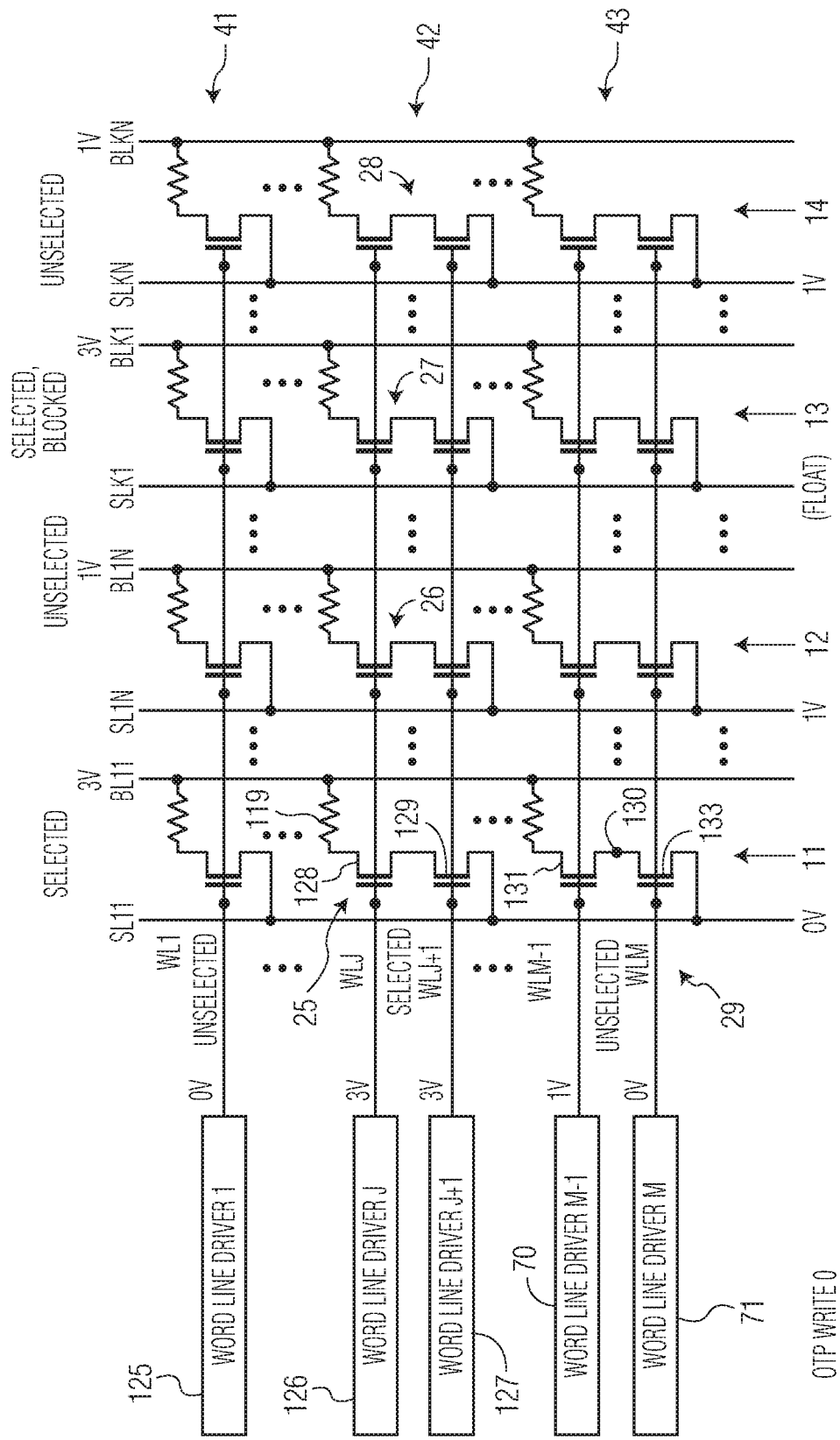
FIG. 5 is a circuit diagram showing voltages applied to conductive structures of a memory during a memory operation according to one embodiment of the present invention.
Figure 6:
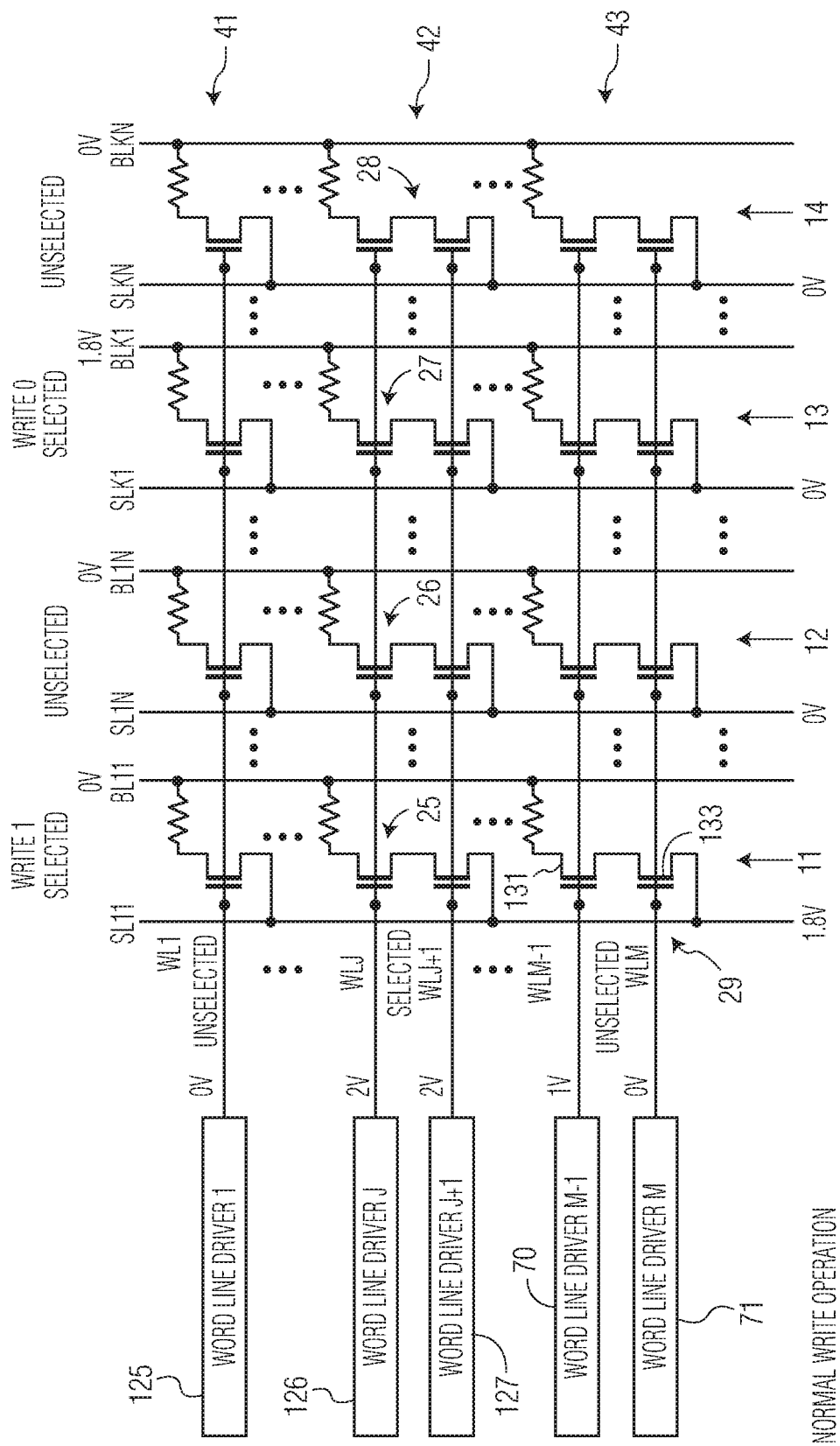
FIG. 6 is a circuit diagram showing voltages applied to conductive structures of a memory during another memory operation according to one embodiment of the present invention.

During a write operation, it may be desirable to increase the word line voltage above 1.8V to turn on the select transistors (e.g. 35 and 37) when either the selected bit line or the selected source line is biased at a high write voltage. According, controller 20 asserts the HVTIME signal at a high voltage during a write operation such that transistor 76 is made nonconductive so that terminal WLWV is not biased by the 1.8 V supply voltage (and supply terminal VDD is not pulled to the higher voltage WLWV). At this time, controller 20 turns on charge pump 72 to raise the voltage of terminal WLWV to the desired, asserted word line voltage during a write. For example, as shown in FIG. 5, WLWV is charged to 3 volts during an OTP write operation, and as shown in FIG. 6, WLWV is charged to 2 volts during a normal write operation After the write operation, controller 20 de-asserts the HVTIME signal to make transistor 76 conductive and turns off charge pump 72 to where terminal WLWV is pulled back to 1.8V.

After completion of the memory operation, PDC line is pulled to a de-asserted low to make transistor 75 conductive to pull node 85 to 1.8V to place word line WLM−1 at a de-asserted voltage.

Word line driver 71 is configured similarity to word line driver 70 except that the unasserted voltage terminal 87 is tied to ground instead of 1V as with driver 70. Accordingly, driver 71 provides an unasserted voltage of 0V on word line WLM instead of an unasserted voltage of 1V as with driver 70. Each of drivers 70 and 71 provide the same asserted voltage of terminal WLWV. However, in other embodiments, the driver pairs may be configured to provide different asserted word line voltages.

Other word line driver pairs of word line drivers 7 (e.g. the word line drivers that control the voltages of word lines WLJ and WLJ+1) that control the two word lines to a row (e.g. 42) are configured similarly to word line drivers 70 and 71. For example, the word line driver that controls the voltage on word line WLJ is similar to word line driver 70 and the word line driver that controls the voltage on word line WLJ+1 is similar to word line driver 71. Those driver circuits associated with rows having only one word line (e.g. row 41 is only associated with WL1) would be similar to driver 71.

In other embodiments, the driver circuits of drivers 7 may have other configurations. For example, in FIG. 2, driver 71 receives the same three decode signals PD[A:C] as driver 70. However, in other embodiments, driver 71 may receive at least one different decode signal from controller 20 than driver 70 where controller 20 would assert both sets to perform an access to the row 43 associated with word lines WLM and WLM−1. In other embodiments, it may not be necessary to have a cascode of transistors like 82,83 instead have a single transistor (e.g. 82 only) to the nonasserted word line supply level (e.g. ground or 1V). In other embodiments, the word line drivers 70 and 71 would share a common input decode stage (e.g. transistor 77-79 and transistor 75) where node 85 of driver 70 and node 88 of driver 71 would be connected. In other embodiments, driver 70 would be an buffer (e.g. two inverters coupled in series) where the input of the buffer is connected to the output (WLM) of driver 71 and where the low supply terminal of the buffer would be connected to the 1V terminal. Also, in other embodiments, the drivers may receive different supply voltages and may include a different number of decode transistors.

Figure 3:
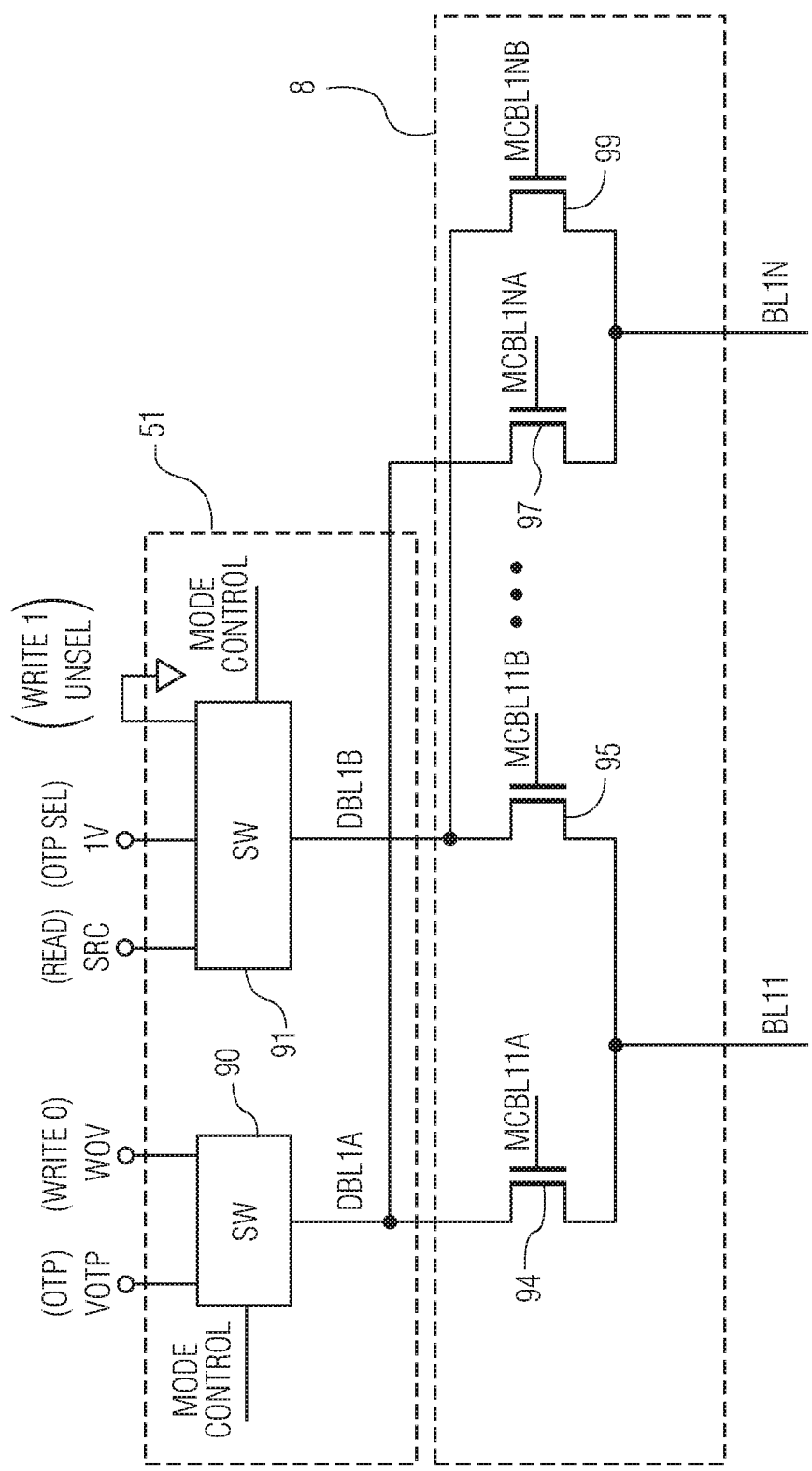
FIG. 3 is a circuit diagram of a bit line driver and a portion of a column multiplexer according to one embodiment of the present invention.

FIG. 3 is a circuit diagram of bit line driver 51 and a portion of column mux 8 that is associated with bit lines BL11-BL1N according to one embodiment of the present invention. In the embodiment of FIG. 3, data bit line DBL1 shown in FIG. 1 is implemented with two data bit lines DBL1A and DBL1B. Column mux 8 includes two NFET transistor (94, 95, 97, 99) for each bit line (BL11-BL1N) for tying each bit line to one of DBL1A or DBL1B during a memory operation. For example, transistor 94 ties BL11 to DBL1A during an OTP operation or for writing a 0 when BL11 is selected, and transistor 95 ties BL11 to DBL1B during a read operation, for writing a 1, or when BL11 is unselected. Transistors 94, 95, 97, and 99 are controlled by MC signals MCBL11A, MCBL11B, MCBL1NA, and MCBL1NB, respectively that are provided by controller 20 and are based on the address of the memory operation, the data (if a write operation), and the type of memory operation being performed.

Driver 51 includes a switch 90 that is connected to DBL1A and that is used to bias DBL1A at voltage VOTP during a one-time programmable write operation to a memory cell coupled to bit lines BL11-BL1N or bias DBL1A at voltage W0V during a write operation of a 0 to a memory cell coupled to bit lines BL11-BL1N, depending upon which operation is being performed. Switch 90 is controlled by the MODE CONTROL signal provide by controller 20. In one embodiment, VOTP is 3 volts and W0V is 1.8 volts, but these may be of other values in other embodiments.

Driver 51 includes a switch 91 that is connected to DBL1B and is used to bias DBL1B at different voltage during different operations performed on cells of bit lines BL11-BL1N. DBL1B is biased by switch 91 at voltage SRC during a read operation, at 1V during an OTP write operation where the bit line is unselected, and at ground when a 1 is being written during a normal operation or when the bit line is unselected during a normal write operation. In one embodiment, SRC is 0.3 volts, but may be of other voltages in other embodiments (e.g. 100-300 mV). Also, a bit line maybe grounded via switch 91 when no operation is being performed. Other bit line drivers and portions of mux 8 of memory 5 may be configured similarly. A bit line driver and column mux may have other configuration in other embodiments including other types of circuits and utilizing other bias voltages depending on the type of operations performed and the type of memory cells being utilize. In some examples, the data bits being written may be provided to the bit line drivers to control the voltages being provided to the asserted bit lines.

Figure 4:
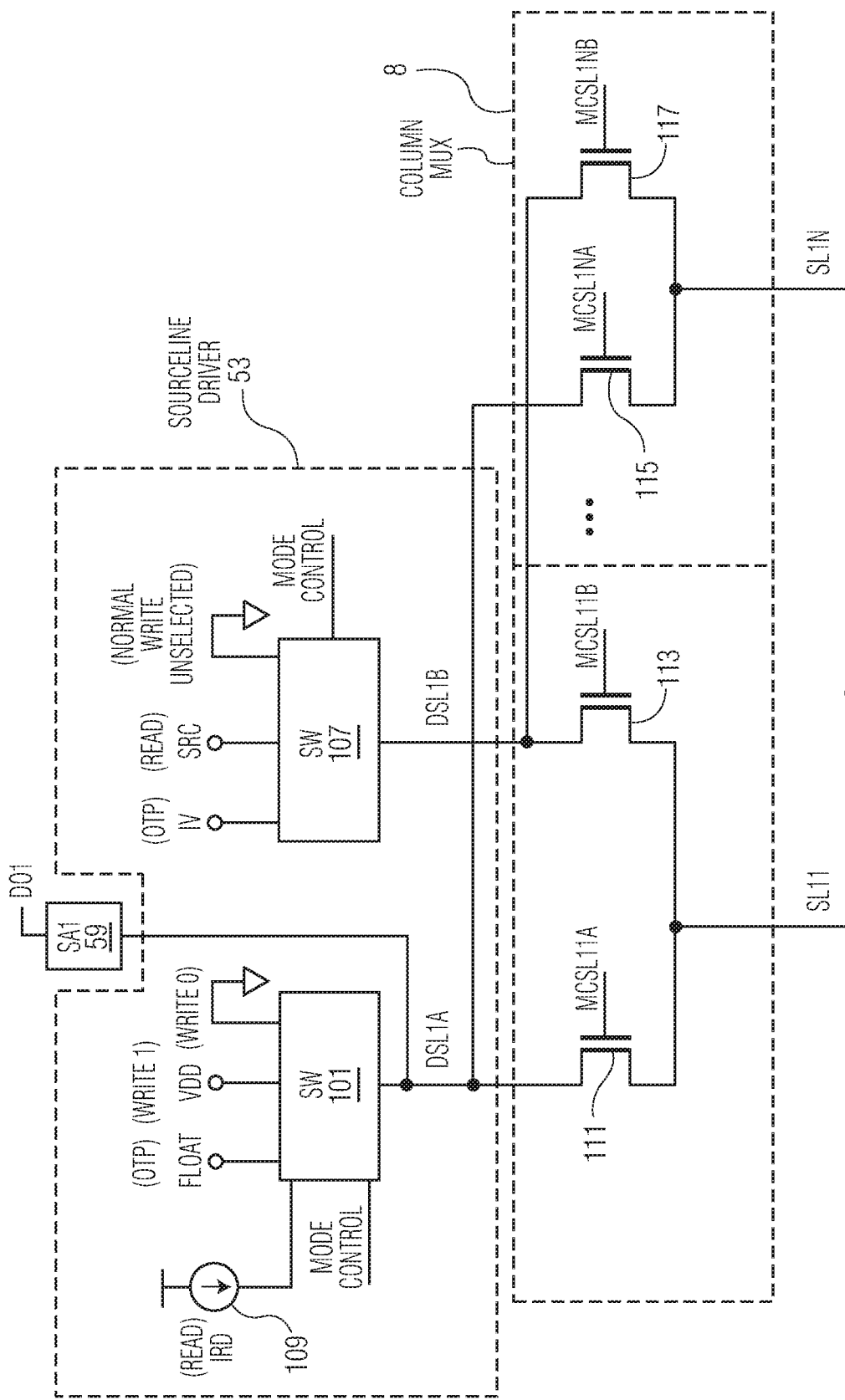
FIG. 4 is a circuit diagram of a source line driver and a portion of a column multiplexer according to one embodiment of the present invention.

FIG. 4 is a circuit diagram of source line driver 53 and a portion of column mux 8 that is associated with source lines SL11 to SL1N according to one embodiment of the present invention. In the embodiment shown, data source line DSL1 shown in FIG. 1 is implemented with two data source lines DSL1A and DSL1B in FIG. 4. Column mux 8 includes two NFET transistors (111, 113, 115, and 117) for each source line (SL11-SL1N) for tying each source line to one of DSL1A or DSL1B during a memory operation. For example, transistor 111 ties SL11 to DSL1A during a read operation, for a blocked OTP operation, for writing a 1, or for writing a 0. Transistor 113 ties SL11 to DSL1B during an unselected read operation, for an unselected write operation, or for an unselected OTP operation. Transistors 111, 113, 115, 117 are controlled by MC signals MCSL11A, MCSL11B, MCSL1NA, and MCSL1NB, respectively, that are provided by controller 20 and are based on the address of the memory operation, the data (if a write operation), and the type of memory operation being performed.

Driver 53 includes a switch 101 that is connected to DSL1A and is used to bias DSL1A at different voltages during different operations performed on cells of bit lines SL11-SL1N. DSL1A is biased by switch 101 at voltage VDD (e.g. 1.8V) during writing a 1 and biased at ground during writing a 0. Switch provides a read current of IRD from current source 109 to DSL1A during a read operation and floats DSL1A during a blocked selected OTP write operation.

Driver 53 includes a switch 107 that is connected to DSL1B and is used to bias DSL1B at different voltage during different operations performed on cells of source lines SL11-SL1N. DSL1B is biased by switch 107 at 1V during an OTP write operation where the source line is unselected, at ground during a normal write when the source line is unselected, and at voltage SRC during a read operation. Switches 101 and 107 are controlled by the MODE CONTROL signal from controller 20. Other source line drivers and portions of mux 8 of memory 5 may be configured similarly. A source line driver and column mux may have other configuration in other embodiments including other types of circuits and utilizing other bias voltages depending on the type of operations performed and the type of memory cells being utilize. In some examples, the data bits being written may be provided to the source line drivers to control the voltages being provided to the asserted bit lines.

Figure 7:
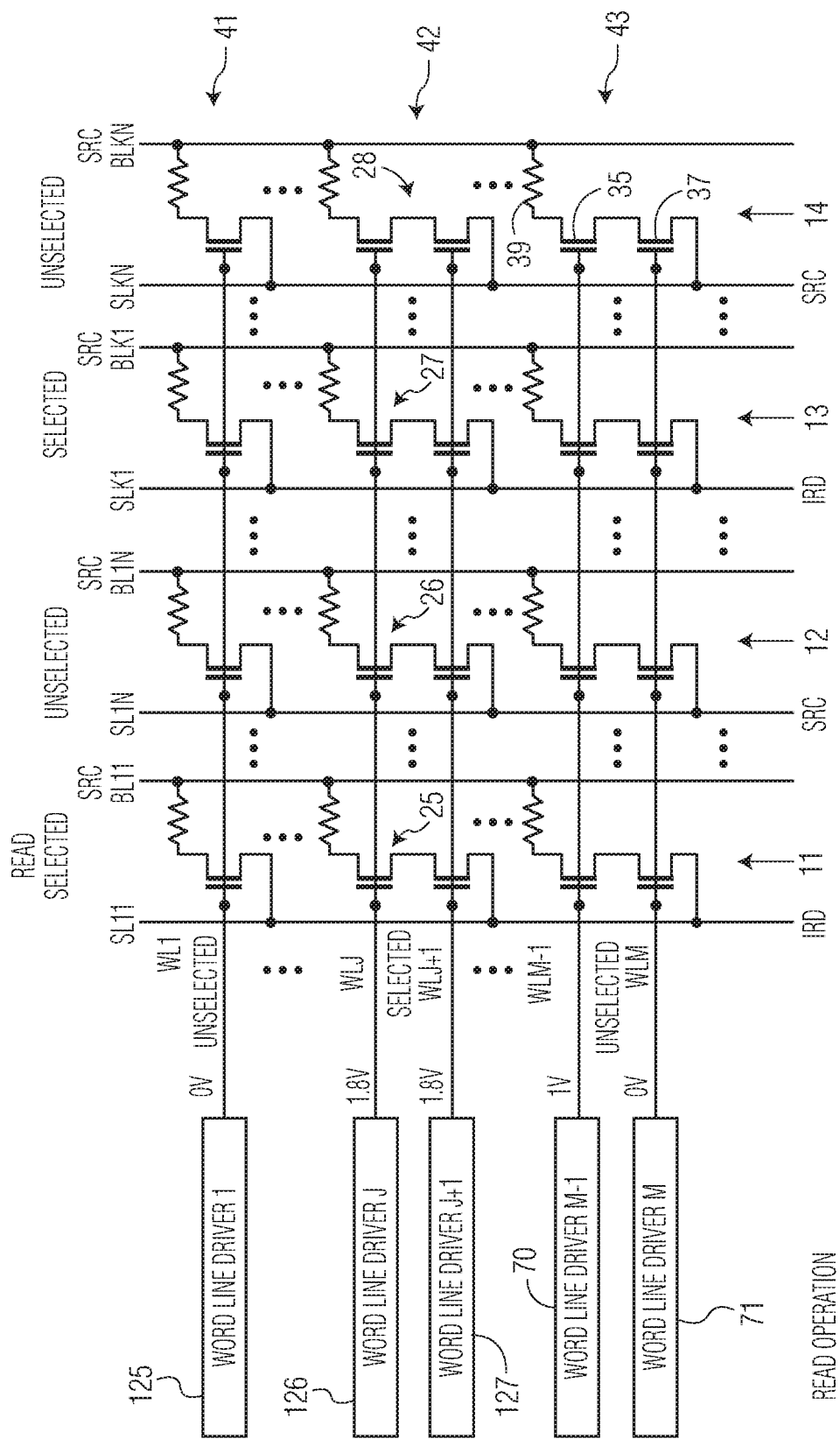
FIG. 7 is a circuit diagram showing voltages applied to conductive structures of a memory during another memory operation according to one embodiment of the present invention.

FIGS. 5, 6, and 7 are circuit diagrams of portions of memory 5 showing the voltages applied to the bit lines, source lines, and word lines during different memory operations by the bit line drivers, source lines drivers, and word line drivers of memory 5. FIG. 5 shows the voltages applied to the bit lines, source lines, and word lines, during a one-time programmable write operation to permanently write cell 25 to a 0 value state. During the illustrated OTP write operation, an asserted word line voltage of 3 volts is applied to word lines WLJ and WLJ+1 to make conductive both of select transistors 128 and 129, respectively, as well as the other select transistors on row 42. To permanently write to storage element 119, 3 volts is placed on BL11, which is the bit line of the selected column 11, by bit line driver 51, and 0V is provided on source line SL11, which is the source line of the selected column, by source line driver 53. Accordingly, with select transistors 128 and 129 being made conductive by the asserted word lines voltages, a 3 volt differential is placed across storage element 119 to generate a sufficient write current through storage element 119 to permanently alter the resistance of cell 25 to store a 0 value.

In the unselected columns 12 and 14, 1 volt is applied to both the unselected bit lines (BL1N, BLKN) and the unselected source lines (SL1N, SLKN). Accordingly, the maximum voltage across the selected transistors of cell 28 of asserted row 42 is a 2 volts between the word lines (WLJ and WLJ+1) at 3 volts and the source lines and bit lines at 1 volt. On the select transistors of cell 27 where SLK1 is floated, the source drain voltage across the select transistors of cell 27 is limited to Vtn.

In FIG. 5, column 13 is designated as "selected, blocked." It is characterized as a selected cell in that it includes a cell 27 in the addressed location that includes cell 25, but for which it is intended that the OTP program operation is not to be performed on cell 27. For example, in one embodiment, if a "1" is to be written to cell 27, then the OTP programing operation would not be performed on cell 27 in that the OTP programming operation of the particular embodiment only writes 0 values. The unprogrammed cells (e.g. 27) are deemed to store a 1 value.

For the blocked column during the OTP write operation, a bit line driver 55 applies 3 Volts to BLK1 and a source line driver 57 floats source line SLK1. Accordingly, no voltage drop is generated across the storage element of cell 27 where it is not written. Other write operations may be performed with other voltages and in other ways in other embodiments. Also, in other embodiments, a blocked column condition may be utilized in normal write operations where values are written to an addressed location in two write operations. In one operation, the 0 values of an address location are written, and the other operation, the 1 values of the address location are written. The columns of the cells of the addressed location would be blocked during the write of the opposite value.

One advantage that may occur in some embodiments with providing a memory cell with two select transistors coupled in series driven by two different word line drivers is that the voltages across the devices of the unselected cells in a selected column (11) can be limited where one select transistor (131) can be made partially conductive such that some of the voltage drop (e.g. 3 volts) from the bit line to the source line is dropped across the partially conductive select transistor 131 to reduce the drain-source voltage across the other select transistor (133) that is nonconductive. In FIG. 5 for cell 29, biasing word line WLM−1 at 1 V makes select transistor 131 partially conductive such that some of the 3 volt drop across cell 29 drops across transistor 131 to where the voltage at node 130 is approximately 1 volt. In some embodiments, transistor 131 acts as a source follower in this condition. Accordingly, the drain-source voltage across transistor 133 is approximately 1 volt. Also, biasing word line WLM−1 at an unasserted voltage of 1 volt reduces the gate-to-drain voltage of select transistor 131 to approximately 2 volts. If WLM−1 were grounded in this situation, then the gate-to-drain voltage of select transistor 131 would be three volts. Accordingly, in some embodiments, utilizing a memory cell with two select transistors in series with each controlled with a separate line driver, may allow a memory to be implemented with lower voltage transistors.

FIG. 6 is a circuit diagram of a portion of memory 5 showing the voltages being applied to the source lines, bit lines, and word lines during a normal write operation. In one embodiment, a normal write operation is where the cells are written to store values where they can be subsequently rewritten as needed to store different values. In some embodiments, the write currents applied to the selected cells are lower than during an OTP write operation. In the embodiment shown, cells to be written with a 0 value are written simultaneously with the cells to be written with a 1 value. For example, FIG. 6 shows that a 1 is to be written to cell 25 and a 0 is to be written to cell 27.

During the write operation, word line drivers 126 and 127 each provide an asserted word line voltage of 2 V on word lines WLJ and WLJ+1, respectively. For writing a 1 to a cell, the source line drivers (53) apply 1.8V to the selected source lines (SL11) of the cells (25) to be written to a 1 and the bit line drivers (51) apply 0V to the selected bit lines (BL11) of the cells (25) to be written. For writing a 0 to a cell (27), the source line drivers (57) apply 0V to the selected source lines (SLK1) of the cells (27) to be written to a 0 and the bit line drivers (55) apply 1.8V to the selected bit lines (BLK1) of the cells to be written to a 0. For the unselected rows with two word lines (e.g. row 43), the word line (WLM−1) controlling the select transistor 131 closest to the storage element is biased at the unasserted voltage of 0V and the other word line (WLM) is biased at 0V. The unselected bit lines and source lines of an unselected column (12,14) are biased at 0V. Other write operations may be performed with other voltages and/or with other actions in other embodiments. For example, referring back to FIG. 2, during a normal write operation, the source of transistor 83 of driver 70 may be switched to a ground bias source such that both drivers provide an unasserted word line voltage of ground during the normal write operation.

FIG. 7 shows a circuit diagram of a portion of memory 5 with the voltages being applied to the word lines, bit lines and source lines during a read operation. In the embodiment shown, cells 25 and 27 of row 42 are being read during the read operation. During the read operation, word line drivers 126 and 127 provide an asserted word line voltage of 1.8V on word lines WLJ and WLJ+1, respectively, to make the select transistors of the cells conductive. For the source lines (SL11, SLK1) of the selected columns (11, 13), the source line drivers (53, 57) provide a read current IRD on the source lines. The bit lines (BL11, BLK1) of the selected columns (11, 13) as well as the source lines (SL1N, SLKN) and bit lines (BL1N, BLKN) of the unselected columns (12, 14) are biased at voltage SRC, which in one embodiment is 0.3V. The sense amplifiers (59, 61) sense the voltages on the selected source lines which are dependent upon the values stored in the storage elements of the selected cells to determine whether a 1 or 0 is stored in the cells. For the nonselected rows (43), the word lines (WLM−1) connected to the select transistors (35) closest to the storage elements (39) are biased at 1V and the other word lines (WLM) connected to the select transistors (37) located farther away from the storage elements (39) are biased at 0V such that no current flows through the cell. Other read operations may be performed with other voltages and/or with other actions in other embodiments. For example, referring back to FIG. 2, during a read operation, the source of transistor 83 of driver 70 may be switched to a ground bias source such that both drivers provide an unasserted word line voltage of ground during the read operation.

FIG. 8 is a circuit diagram of memory 5 according to one embodiment showing how memory array 10 can be converted from a design of a memory having only "single select transistor" memory cells to a memory having "two select transistor" memory cells. In the embodiment of FIG. 8, row 43 has been converted from two adjacent rows 152 and 154 each having only "single select transistor" memory cells (similar to rows 41 and 151) by combining pairs of cells on those rows 152 and 154. The cells of row 43 are made by connecting the select transistor of a cell on row 152 with a select transistor from a cell on row 154 that is located in the same column, disabling a storage element of one of the cells by disconnecting it from the bit line, and disconnecting one of the select transistors form the source line. For example, for cell 32, select transistor 35 of row 152 is connected to select transistor 37 of row 154 by connection 162. The connection of the source of select transistor 35 to source line SLKN is removed (as shown by "X" 163), and storage element 160 of row 154 is disabled by removing a connection between its electrode to bit line BLKN as shown by "X" 161. Referring back to FIG. 2, another change to be made is that the row decoder lines (PD[A:C]) provided to word line driver 70 are connected to the row decoder inputs of word line driver 71. Also, the source of transistor 83 of driver 70 would be connected to a 1 volt terminal instead of ground to provide the unasserted word line voltage. In one embodiment, these changes can be made by making changes in the interconnect lines of a wafer during wafer fabrication. In other embodiments, a memory array with "two select transistor" cells can be made from a design of a memory with "single select transistor" cells by providing or removing other connections.

Producing a memory design that includes two select transistor cells from a memory design of single select transistor cells may in some embodiments, reduce the time and effort needed in designing a memory with two select transistor cells. With some embodiments, such a memory may be designed by making minor changes to the memory design. However, in other embodiments, the design of a memory with two select transistor cells is not based on a design of a memory with only single select transistor cells (e.g. they would not include rows of disabled storage elements (160)).

As shown herein, providing a memory with cells having two select transistors that are controlled by two separate addressable word line drivers, may in some embodiments, enable a memory to simultaneously provide different voltages to the two select transistors during certain memory operations. Although the above describes where different non asserted voltages are provided on the two word lines, in other embodiments, different asserted voltages may be provided on the two word lines during certain operations (e.g. during an OTP write operation). Furthermore, providing two different word line voltages for a row may be utilized in a memory with ReRAM cells during a forming memory operation of the cells.

Also, providing a memory cell with two select transistors and a storage element coupled in series where a select transistor is located between the storage element and other select transistor may enable the memory cell to be biased at conditions that reduce the voltage drop across any two electrodes of the select transistors within a non damaging range.

Other memories may have different configurations in other embodiments. For example, in other embodiments, other types of memory cells may be used. Also, other embodiment may include memory arrays with a different number of select lines (e.g. two write bit lines and a read bit line). As used herein, bit lines and source lines are both select lines. Also, memories of other embodiments may have other configurations and/or other circuits that perform other functions not described herein. For example, the bit line and source line drivers may include transistors whose gates are controlled to regulate the voltage provided on the bit line or source line. Also, in other embodiments, column mux 8, source line drivers (53), and bit line drivers (51) may be integrated in other ways to provide the selected and unselected select line voltages and currents during a memory operation.

A gate is a control electrode for a FET and the source and drains are current electrodes for a FET. However, the circuitry of a memory may be implemented with other types of transistors in other embodiments. An addressable word line driver is a word line driver that provides an asserted or nonasserted word line voltage during a memory operation based at least in part on the memory address of the memory operation. Features shown or described with one embodiment may be implemented with other embodiments shown or described.

In one embodiment, a memory includes a plurality of memory cells. Each memory cell of the plurality of memory cells including a first select transistor, a second select transistor, and a storage element coupled in series. The first select transistor is located in series between the second select transistor and the storage element with the second select transistor being coupled to the first select transistor on a first current electrode side of the first select transistor and the storage element being coupled to the first select transistor on a second current electrode side of the first select transistor. The memory includes a first set of word lines. Each word line of the first set of word lines is coupled to a control electrode of the first select transistor of each memory cell of a subset of memory cells of a plurality of subsets of the plurality of memory cells. The subset of memory cells is associated with the each word line of the first set. The memory includes a second set of word lines. Each word line of the second set of word lines is coupled to a control electrode of the second select transistor of each memory cell of a subset of memory cells of the plurality of subsets. The subset of memory cells is associated with the each word line of the second set. The memory includes a first set of addressable word line drivers. Each addressable word line driver of the first set of addressable word line drivers including an output to control a voltage of a word line of the first set of word lines associated with the each addressable word line driver of the first set of addressable word line drivers. The memory includes a second set of addressable word line drivers. Each addressable word line driver of the second set of addressable word line drivers including an output to control a voltage of a word line of the second set of word lines associated with the each addressable word line driver of the second set of addressable word line drivers.

Another embodiment includes a method of operating a memory. The memory includes a plurality of subsets of memory cells. Each memory cell of the plurality of subsets of memory cells including a first select transistor, a second select transistor, and a storage element coupled in series, wherein the first select transistor is located in series between the second select transistor and the storage element with the second select transistor being coupled to the first select transistor on a first current electrode side of the first select transistor and the storage element being coupled to the first select transistor on a second current electrode side of the first select transistor. The method includes performing a first memory operation including accessing memory cells of a first subset of memory cells of the plurality of subsets. The performing the first memory operation includes providing an asserted word line voltage by a first word line driver on a first word line of a first set of word lines with the first word line coupled to the first select transistors of the first subset of memory cells and providing an asserted word line voltage by a second word line driver on a second word line of a second set of word lines with the second word line coupled to the second select transistors of the first subset of memory cells. The method includes performing a second memory operation including accessing memory cells of a second subset of memory cells of the plurality of subsets and not accessing memory cells of the first subset, wherein performing the second memory operation includes providing by the first word line driver, a nonasserted word line voltage on a first word line and providing by the second word line driver, a nonasserted word line voltage on the second word line.

In another embodiment, a memory includes a plurality of memory cells. Each memory cell of the plurality of memory cells including a first select transistor, a second select transistor, and a storage element. The memory includes a first set of word lines. Each word line of the first set of word lines is coupled to a control electrode of the first select transistor of each memory cell of a subset of memory cells of a plurality of subsets of the plurality of memory cells. The subset of memory cells is associated with the each word line of the first set of word lines. The memory includes a second set of word lines. Each word line of the second set of word lines is coupled to a control electrode of the second select transistor of each memory cell of a subset of memory cells of the plurality of subsets. The subset of memory cells is associated with the each word line of the second set of word lines. The memory includes a first set of addressable word line drivers. Each addressable word line driver of the first set of addressable word line drivers including an output to control a voltage of a word line of the first set of word lines associated with the each addressable word line driver of the first set of addressable word line drivers. The memory includes a second set of addressable word line drivers. Each addressable word line driver of the second set of addressable word line drivers including an output to control a voltage of a word line of the second set of word lines associated with the each word line driver of the second set of addressable word line drivers. For at least one type of memory operation where no memory cells of a subset of memory cells of the plurality of subsets are being accessed, an addressable word line driver of the first set of addressable word line drivers provides a nonasserted word line voltage on its associated word line of the first set of word lines that is associated with the subset of memory cells and an addressable word line driver of the second set of addressable word line drivers provides a nonasserted word line voltage on its associated word line of the second set of word lines that is associated with the subset of memory cells that is different from the nonasserted word line voltage provided by the addressable word line driver of the first set of addressable word line drivers on its associated word line of the first set of word lines.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a plurality of memory cells, each memory cell of the plurality of memory cells including a first select transistor, a second select transistor, and a storage element coupled in series, wherein the first select transistor is located in series between the second select transistor and the storage element with the second select transistor being coupled to the first select transistor on a first current electrode side of the first select transistor and the storage element being coupled to the first select transistor on a second current electrode side of the first select transistor;
   a first set of word lines, each word line of the first set of word lines is coupled to a control electrode of the first select transistor of each memory cell of a subset of memory cells of a plurality of subsets of the plurality of memory cells, where the subset of memory cells is associated with the each word line of the first set;
   a second set of word lines, each word line of the second set of word lines is coupled to a control electrode of the second select transistor of each memory cell of a subset of memory cells of the plurality of subsets, where the subset of memory cells is associated with the each word line of the second set;
   a first set of addressable word line drivers, each addressable word line driver of the first set of addressable word line drivers including an output to control a voltage of a word line of the first set of word lines associated with the each addressable word line driver of the first set of addressable word line drivers;
   a second set of addressable word line drivers, each addressable word line driver of the second set of addressable word line drivers including an output to control a voltage of a word line of the second set of word lines associated with the each addressable word line driver of the second set of addressable word line drivers;
   wherein:

the first set of addressable word line drivers are each configured to provide a higher asserted voltage on their associated word lines of the first set of word lines during a one-time programmable operation than during a normal write operation;

the second set of addressable word line drivers are each configured to provide a higher asserted voltage on their associated word lines of the second set of word lines during a one-time programmable operation than during a normal write operation.

2. The memory of claim 1 wherein:

each of the first set of addressable word line drivers provides a first unasserted word line voltage on a word line of the first set of word lines associated with the each addressable word line driver of the first set of addressable word line drivers during at least one type of memory operation where no memory cells of a subset of memory cells of the plurality of subsets associated with the word line are being accessed;

each of the second set of addressable word line drivers provides a second unasserted word line voltage on a word line of the second set of word lines associated with the each addressable word line driver of the second set of addressable word line drivers during the at least one type of memory operation where no memory cells of a subset of memory cells of the plurality of subsets associated with the word line are being accessed;

the second unasserted word line voltage is different than the first unasserted word line voltage.

3. The memory of claim 2 wherein:

the first unasserted word line voltage is higher than the second unasserted word line voltage.

4. The memory of claim 2 wherein during memory access operations to memory cells of a subset of memory cells of the plurality of subsets of the plurality of memory cells, an addressable word line driver of the first set of addressable word line drivers associated with a word line of the first set of word lines associated with the subset of memory cells provides a voltage that matches a voltage provided by an addressable word line driver of the second set of addressable word line drivers associated with a word line of the second set of word lines associated with the subset of memory cells.

5. A memory comprising:

a plurality of memory cells, each memory cell of the plurality of memory cells including a first select transistor, a second select transistor, and a storage element coupled in series, wherein the first select transistor is located in series between the second select transistor and the storage element with the second select transistor being coupled to the first select transistor on a first current electrode side of the first select transistor and the storage element being coupled to the first select transistor on a second current electrode side of the first select transistor;

a first set of word lines, each word line of the first set of word lines is coupled to a control electrode of the first select transistor of each memory cell of a subset of memory cells of a plurality of subsets of the plurality of memory cells, where the subset of memory cells is associated with the each word line of the first set;

a second set of word lines, each word line of the second set of word lines is coupled to a control electrode of the second select transistor of each memory cell of a subset of memory cells of the plurality of subsets, where the subset of memory cells is associated with the each word line of the second set;

a first set of addressable word line drivers, each addressable word line driver of the first set of addressable word line drivers including an output to control a voltage of a word line of the first set of word lines associated with the each addressable word line driver of the first set of addressable word line drivers;

a second set of addressable word line drivers, each addressable word line driver of the second set of addressable word line drivers including an output to control a voltage of a word line of the second set of word lines associated with the each addressable word line driver of the second set of addressable word line drivers:

wherein:

each of the first set of addressable word line drivers provides a first unasserted word line voltage on a word line of the first set of word lines associated with the each addressable word line driver of the first set of addressable word line drivers during at least one type of memory operation where no memory cells of a subset of memory cells of the plurality of subsets associated with the word line are being accessed;

each of the second set of addressable word line drivers provides a second unasserted word line voltage on a word line of the second set of word lines associated with the each addressable word line driver of the second set of addressable word line drivers during the at least one type of memory operation where no memory cells of a subset of memory cells of the plurality of subsets associated with the word line are being accessed;

the second unasserted word line voltage is different than the first unasserted word line voltage;

where the at least one type of memory operation includes an OTP write operation;

wherein:

the first set of addressable word line drivers are each configured to provide a higher asserted voltage on their associated word lines of the first set of word lines during a one-time programmable operation than during a normal write operation;

the second set of addressable word line drivers are each configured to provide a higher asserted voltage on their associated word lines of the second set of word lines during a one-time programmable operation than during a normal write operation.

6. The memory of claim 1 wherein during memory access operations to memory cells of a subset of memory cells of the plurality of subsets of the plurality of memory cells, an addressable word line driver of the first set of addressable word line drivers associated with a word line of the first set of word lines associated with the subset of memory cells provides a voltage that matches a voltage provided by an addressable word line driver of the second set of addressable word line drivers associated with a word line of the second set of word lines associated with the subset of memory cells.

7. The memory of claim 1 wherein the memory cells of the plurality of memory cells are characterized as resistive memory cells.

8. A memory comprising:

a plurality of memory cells, each memory cell of the plurality of memory cells including a first select transistor, a second select transistor, and a storage element coupled in series, wherein the first select transistor is located in series between the second select transistor and the storage element with the second select transistor being coupled to the first select transistor on a first current electrode side of the first select transistor and the storage element being coupled to the first select transistor on a second current electrode side of the first select transistor;

a first set of word lines, each word line of the first set of word lines is coupled to a control electrode of the first select transistor of each memory cell of a subset of memory cells of a plurality of subsets of the plurality of memory cells, where the subset of memory cells is associated with the each word line of the first set;

a second set of word lines, each word line of the second set of word lines is coupled to a control electrode of the second select transistor of each memory cell of a subset of memory cells of the plurality of subsets, where the subset of memory cells is associated with the each word line of the second set;

a first set of addressable word line drivers, each addressable word line driver of the first set of addressable word line drivers including an output to control a voltage of a word line of the first set of word lines associated with the each addressable word line driver of the first set of addressable word line drivers;

a second set of addressable word line drivers, each addressable word line driver of the second set of addressable word line drivers including an output to control a voltage of a word line of the second set of word lines associated with the each addressable word line driver of the second set of addressable word line drivers;

a second plurality of memory cells, each memory cell of the second plurality of memory cells including a storage element and only one select transistor, wherein the memory cells of the first plurality of memory cells are located in an array of memory cells with the memory cells of the second plurality of memory cells.

9. A memory comprising:

a plurality of memory cells, each memory cell of the plurality of memory cells including a first select transistor, a second select transistor, and a storage element;

a first set of word lines, each word line of the first set of word lines is coupled to a control electrode of the first select transistor of each memory cell of a subset of memory cells of a plurality of subsets of the plurality of memory cells, where the subset of memory cells is associated with the each word line of the first set of word lines;

a second set of word lines, each word line of the second set of word lines is coupled to a control electrode of the second select transistor of each memory cell of a subset of memory cells of the plurality of subsets, where the subset of memory cells is associated with the each word line of the second set of word lines;

a first set of addressable word line drivers, each addressable word line driver of the first set of addressable word line drivers including an output to control a voltage of a word line of the first set of word lines associated with the each addressable word line driver of the first set of addressable word line drivers;

a second set of addressable word line drivers, each addressable word line driver of the second set of addressable word line drivers including an output to control a voltage of a word line of the second set of word lines associated with the each word line driver of the second set of addressable word line drivers;

wherein for at least one type of memory operation where no memory cells of a subset of memory cells of the plurality of subsets are being accessed, an addressable word line driver of the first set of addressable word line drivers provides a nonasserted word line voltage on its associated word line of the first set of word lines that is associated with the subset of memory cells and an addressable word line driver of the second set of addressable word line drivers provides a nonasserted word line voltage on its associated word line of the second set of word lines that is associated with the subset of memory cells that is different from the nonasserted word line voltage provided by the addressable word line driver of the first set of addressable word line drivers on its associated word line of the first set of word lines;

wherein:
the first set of addressable word line drivers are each configured to provide a higher asserted voltage on their associated word lines of the first set of word lines during a one-time programmable write operation than during a normal write operation;
the second set of addressable word line drivers are each configured to provide a higher asserted voltage on their associated word lines of the second set of word lines during a one-time programmable write operation than during a normal write operation.

10. A memory comprising:

a plurality of memory cells, each memory cell of the plurality of memory cells including a first select transistor, a second select transistor, and a storage element;

a first set of word lines, each word line of the first set of word lines is coupled to a control electrode of the first select transistor of each memory cell of a subset of memory cells of a plurality of subsets of the plurality of memory cells, where the subset of memory cells is associated with the each word line of the first set of word lines;

a second set of word lines, each word line of the second set of word lines is coupled to a control electrode of the second select transistor of each memory cell of a subset of memory cells of the plurality of subsets, where the subset of memory cells is associated with the each word line of the second set of word lines;

a first set of addressable word line drivers, each addressable word line driver of the first set of addressable word line drivers including an output to control a voltage of a word line of the first set of word lines associated with the each addressable word line driver of the first set of addressable word line drivers;

a second set of addressable word line drivers, each addressable word line driver of the second set of addressable word line drivers including an output to control a voltage of a word line of the second set of word lines associated with the each word line driver of the second set of addressable word line drivers;

wherein for at least one type of memory operation where no memory cells of a subset of memory cells of the plurality of subsets are being accessed, an addressable word line driver of the first set of addressable word line drivers provides a nonasserted word line voltage on its associated word line of the first set of word lines that is associated with the subset of memory cells and an addressable word line driver of the second set of addressable word line drivers provides a nonasserted word line voltage on its associated word line of the second set of word lines that is associated with the subset of memory cells that is different from the nonasserted word line voltage provided by the addressable word line driver of the first set of addressable word line drivers on its associated word line of the first set of word lines;

wherein during a one-time programmable write operation to memory cells of a subset of memory cells of the plurality of subsets of the plurality of memory cells, driver circuitry of the memory floats a source line of a first memory cell of the subset not being written to and biases at a voltage a source line of a second memory cell of the subset not being written to.

* * * * *